United States Patent [19]
Barth et al.

[11] Patent Number: 5,504,670
[45] Date of Patent: Apr. 2, 1996

[54] METHOD AND APPARATUS FOR ALLOCATING RESOURCES IN A MULTIPROCESSOR SYSTEM

[75] Inventors: Roger E. Barth, Cameron Park, Calif.; Stephen C. Schade, Corrales, N.M.; Robert J. Pochowski, Sunnyvale, Calif.; Keath A. Armstrong, Monte Sereno, Calif.; David J. Adair, Campbell, Calif.

[73] Assignee: Intel Corporation, Santa Clara, Calif.

[21] Appl. No.: 40,429

[22] Filed: Mar. 31, 1993

[51] Int. Cl.⁶ .............................................. G01R 31/3177
[52] U.S. Cl. .............................. 364/134; 371/30; 395/650
[58] Field of Search ............................ 371/27, 21.1, 11.1; 364/134; 395/650; 324/765

[56] References Cited

U.S. PATENT DOCUMENTS

| | | |
|---|---|---|
| 4,546,472 | 10/1985 | Volk et al. . |
| 4,606,025 | 8/1986 | Peters et al. ............................ 371/21.1 |
| 4,658,400 | 4/1987 | Brown et al. . |
| 4,759,021 | 7/1988 | Kawaguchi et al. ..................... 371/27 |
| 4,799,008 | 1/1989 | Kannari ..................................... 371/27 |
| 5,265,101 | 11/1993 | Mydill et al. ............................. 371/27 |

Primary Examiner—Ellis B. Ramirez
Assistant Examiner—Thomas Peeso
Attorney, Agent, or Firm—Blakely, Sokoloff, Taylor & Zafman

[57] ABSTRACT

A computer system having multiple processors and multiple resources for use by the processors when executing their assigned tasks. The computer system includes a plurality of sub-controllers which allow the resources within the computer system to be allocated among the processors, such that each of the processors has the resources required to complete its task.

13 Claims, 8 Drawing Sheets

FIG. 1 (PRIOR ART)

FIG_2 (PRIOR ART)

FIG._3 (PRIOR ART)

FIG_6

FIG_7

METHOD AND APPARATUS FOR ALLOCATING RESOURCES IN A MULTIPROCESSOR SYSTEM

FIELD OF THE INVENTION

The present invention relates to the field of computer systems; particularly, the present invention relates to the field of testers for integrated circuits.

BACKGROUND OF THE INVENTION

Integrated circuits (ICs) are utilized today in many areas including those not associated with the computer industry. These integrated circuits are usually produced by a fabrication process, such as metal-oxide semiconductor fabrication. Due to the importance of the proper functioning of these devices, it is essential that comprehensive testing be performed when they are being mass produced to ensure that each of the ICs performs as designed and is as fault and error free as possible. Therefore, every chip is tested during production to determine whether defects in the microelectronic circuit elements fabricated in the device will adversely affect the performance of the device.

Since ICs are so widely used, the overhead in terms of testing costs and man hours is a serious concern of the semiconductor manufacturer. For simple chip designs, it is a simple matter to test the chip as a whole. Obviously, as chip designs become more complex, the physical overhead and time required for testing can contribute enormously to the overall cost of the devices. In testing a chip, a set of test inputs, commonly referred to as test vectors, are developed and applied to the inputs of the device. If the chip is in good condition, the chip will produce results in response to these test vectors which will match a set of expected results.

Figure 1:
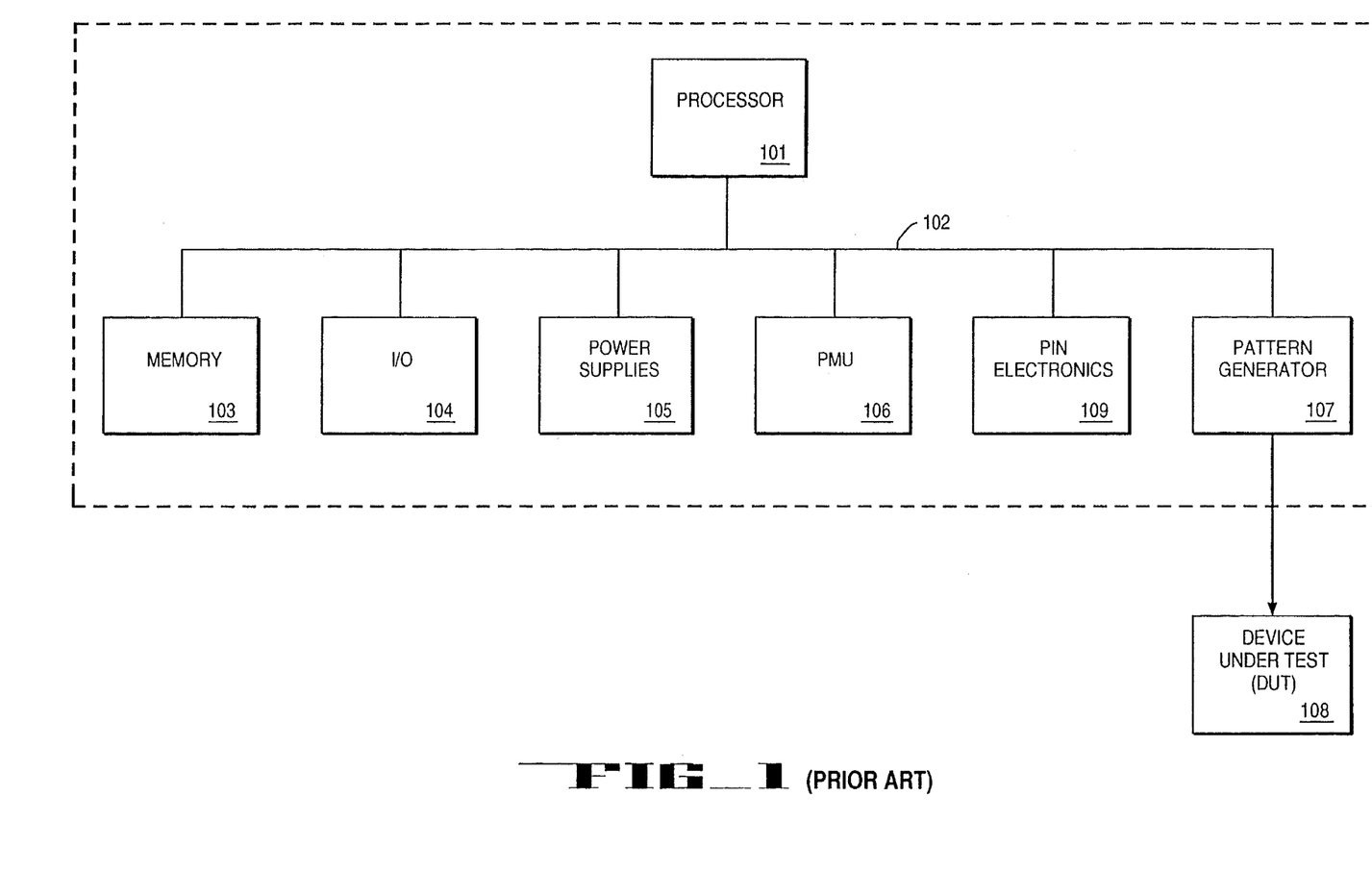
FIG. 1 is a block diagram of a single site prior art tester.

Prior art IC testers are categorized as either single site testers or multi-site testers. Single site testers test one device at a time, while multi-site testers test multiple devices at the same time. A single site tester is shown in FIG. 1. Referring to FIG. 1, the single site tester 100 usually comprises a processor 101 and multiple resources coupled to a bus 102. Processor 101 controls the operation of the tester. The resources are typically memory 103, input/output peripherals 104, power supplies 105, power management resources 106 and a pattern generator 107. Pattern generator 107 provides the test vectors to the device under test (DUT) 108 (i.e., the device which is currently being tested). DUT 108 is normally either a memory device, processing device (e.g., a microprocessor), a sub-controller device or other integrated circuit device that requires testing.

The resources that are required for use in testing an IC are application specific. Each specific integrated circuit design may require different amounts of these resources. For example, to provide the necessary test vectors, the memory resources available to a processor in a tester may have to be increased. Therefore, a tester must be designed so that it can provide all the resources that are required in testing of the device (i.e., the chip). Also note that in a single site tester, a single processor controls the supply of the test vectors. It is possible with such a configuration to test multiple devices at the same time where all are running the same processes. However, the single processor must have the capability of determining which DUTs pass or fail the test criteria. In prior art, it is also possible for a single vector sub-controller to test multiple devices (DUTs) at a time even with different DUT pin counts and DUT functionality assuming the test vectors are linear in execution (i.e., no loops, branches, etc.). However, testers of the prior art are not hardware configured to accept devices which require only 63 pins, 22 pins or other numbers of pins at the same time. The testers of the prior art must have partitions that are the same size (i.e., pin groupings which are the same size). It is desirable to be able to test devices having different pin counts at the same time.

With multi-site testers, multiple ICs may be tested at the same time by placing each IC in a different site. Note that in a multi-site tester, resources are allocated to each site. Because each site must be able to accommodate different ICs, each site must be allocated with the maximum amount of resources that would be needed to provide testing for every possible IC that may be tested. If some of the resources are not utilized during the testing of a particular IC, then those resources are, in effect, wasted. It would be desirable to provide a testing environment in which the sites of the tester can be allocated with only those resources that are required to complete the testing. Note that this problem exists in other prior art testing configurations. For instance, in one prior art tester embodiment, each pin is allocated a predetermined number of dedicated resources. As with the multi-site tester, these resources are often not fully utilized, thereby wasting those unused resources.

Figure 2:
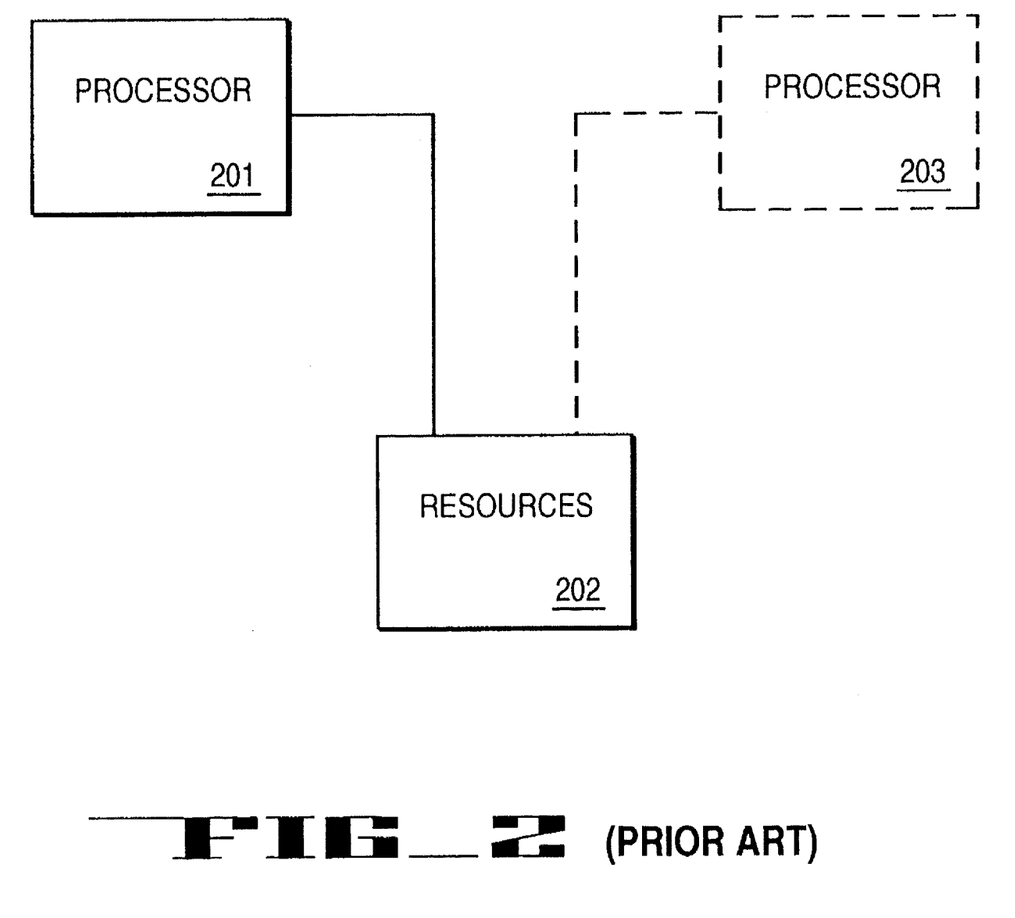
FIG. 2 is a block diagram of a prior art multi-processor computer system.

Note that in a multi-site tester, one processor controls the testing operation for all the sites. In other words, one processor acts as the master for the system. The master/slave relationship between one control element and the other control elements in a system is also found in computer systems in which resources are shared. A typical prior art system is shown in FIG. 2 wherein processor 201 has access to a set of resources 202. Resources 202 would typically include at least memory and I/O facilities. Resources 202 are shared with another processor 203, which is often a digital signal processor in prior art computer system configurations. In such a system, processor 201 controls the resources and shuts off or prevents processor 203 from accessing the resources when processor 201 is using them.

Figure 3:
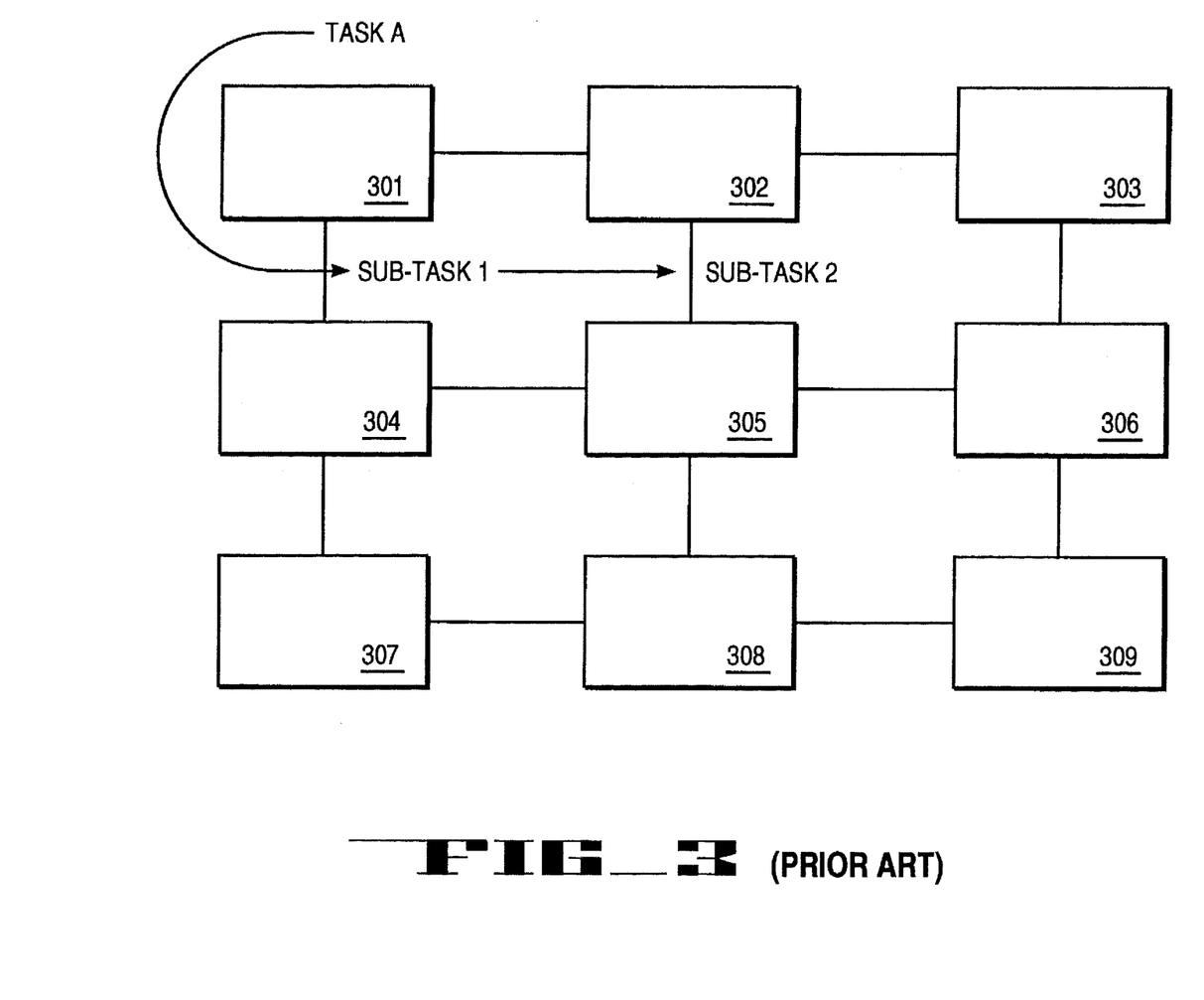
FIG. 3 is a block diagram of a node-based computer system of the prior art.

Node-based computer systems have the same limitations. In the parallel processing environment of a node based system, if a task is being performed by a processing element and that processing element does not have enough resources, then a sub-task is formed. The sub-task has it own dedicated set of resources of which the processing element of the main task does not have access. An example of such a system is shown in FIG. 3. Referring to FIG. 3, multiprocessing elements 301–304 are coupled to one another. For example, processing element 301 is coupled to processing elements 302 and 304 and processing element 304 is coupled to processing elements 305–307. Each of processing elements 301–309 has its own set of dedicated resources. In the system of FIG. 3, Task A is given to processing element 301 for execution. In performing Task A, processing element 301 determines that additional resources are required, so sub-task 1 is formed and sent to processing element 304 for completion. Similarly, if sub-task 1 requires additional resources, another sub-task (e.g., sub-task 2), is formed and sent to one of the processing element, such as processing element 305, for completion. If Task A is an independent process that does not require sub-task 1 for completion, then the two tasks can be performed in parallel. If Task A is not an independent process, then it must wait for sub-task 1 to be completed. In any case, the only accesses Task A has over the resources utilized by sub-task 1 is by sending a task to be completed to sub-task 1. The same is true when sending a sub-task, such as that sent to processing element 305. It is desirable to have more than one task being accomplished at the same time and still have some control over the resources.

The present invention provides a computer system which allows the resources to be utilized by more than one processing element while performing more than one task at one time. The present invention also provides a multi-site testing arrangement in which the resources are not dedicated to one site, such that resources may be allocated to processes that require them. In this manner, the present invention provides a multi-site integrated circuit tester which utilizes the resources more efficiently.

SUMMARY OF THE INVENTION

An integrated circuit tester for use in testing multiple integrated circuits is described. The tester includes multiple processing elements. Each of the processing elements executes a task designed to test one type of integrated circuit, such that a multiple tasks are executed by the processors. The tester includes multiple resources which are used by the processing elements to complete their tasks. The tester also includes means to allocate the resources to each of the processing elements, wherein each processing elements has the resources that are necessary to perform its task, such that different types of integrated circuits may be tested at the same time.

BRIEF DESCRIPTION OF DRAWINGS

The present invention will be understood more fully from the detailed description given below and from the accompanying drawings of the preferred embodiments of the invention, which, however, should not be taken to limit the invention to the specific embodiments, but are for explanation and understanding only.

DETAILED DESCRIPTION OF THE INVENTION

A multi-processing system having allocable resources is described. In the following description, numerous specific details are set forth such as specific numbers of processors, resources, etc., in order to provide a thorough understanding of the present invention. It will be obvious, however, to one skilled in the art that the present invention may be practiced without these specific details. In other instances, well-known computer operations and components have been shown in block diagram form, rather than in detail, to avoid unnecessarily obscuring the present invention.

Overview of the Computer System of the Present Invention

Figure 4:
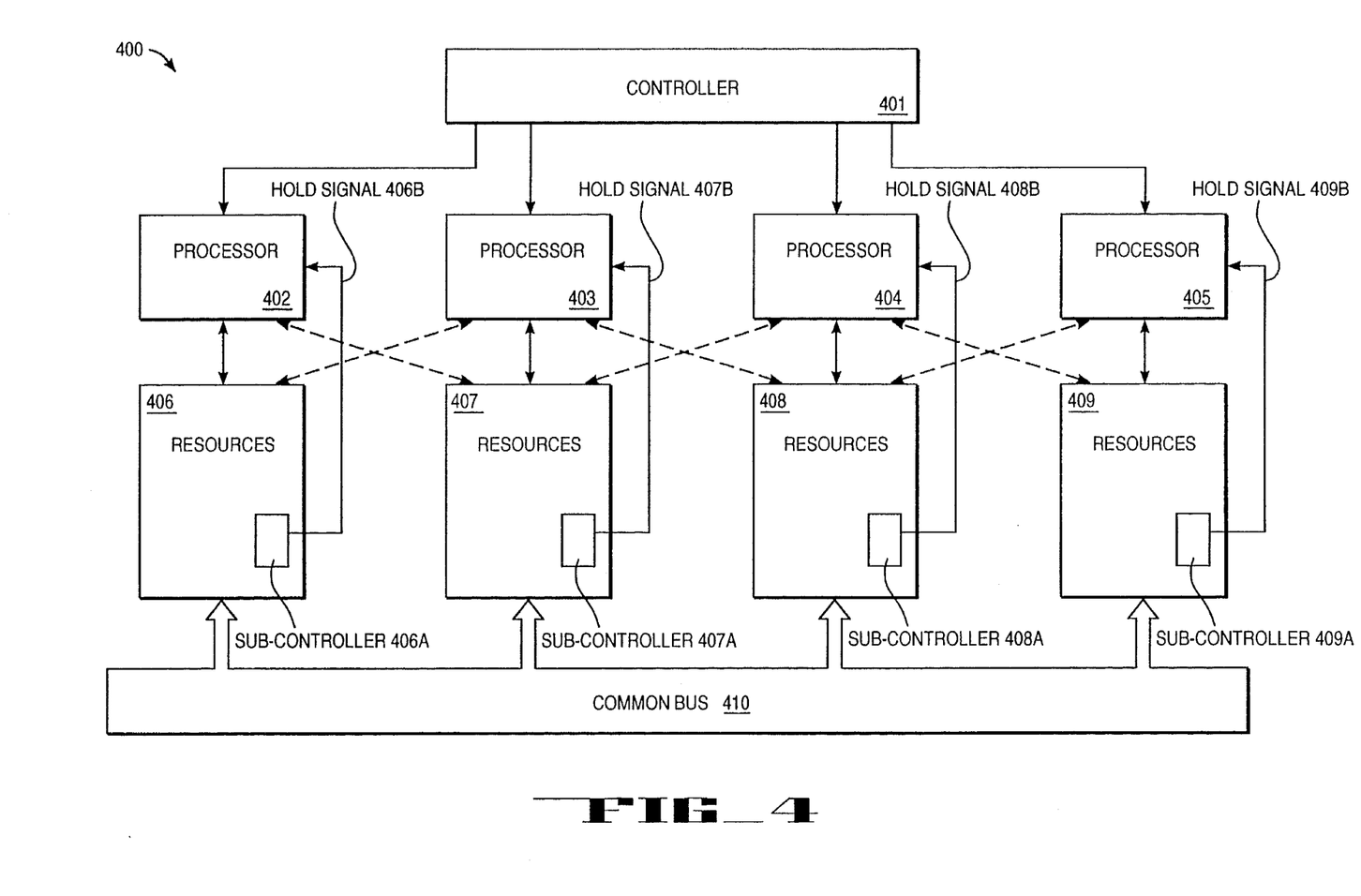
FIG. 4 is a block diagram of the computer system of the present invention.

FIG. 4 illustrates the computer system of the present invention. Referring to FIG. 4, controller 401 is coupled to each of processors 402–405. Note that only four processors are shown for illustration only. The actual number of processors in the computer system is a design choice dependent on the requirements of the manufacturer and the needs of the user (e.g., the requirements of the application(s) involved). Each of processors 402–405 are independent processors which are capable of running independently distinct tasks. The tasks completed by the processors are assigned to them by controller 401. Processors 402–405 complete their assigned tasks using the resources that are available to them.

Each of processors 402–405 is associated with a number of resources which are initially allocated to an individual processor. As illustrated in FIG. 4, resources 406–409 are initially mapped for use by processors 402–405 respectively. The types of resources available for each processor in the system are application specific. Resources 406–409 could include memory, input/output (I/O) components and hardware, pin electronics (which change the tester generated digital signals that are needed to be driven to the DUT to analog signals for the DUT and change the analog signals from the DUT to digital signals for the tester internals), power supplies, pattern generators, error analysis routines and integrated circuit repair routines, error analysis routines and other various other peripherals which might be required to allow an individual processor in the computer system to complete an assigned task.

The present invention allows each of processors 402–405 to gain control of the resources which are allocated to the other processors in the system. For example, if one of the processors requires additional memory, the processor may obtain more memory resources from one of the other processors in the system. In other words, the present invention allows the resources to be reallocated among the processors in the system from their initial mappings.

In the currently preferred embodiment, the reallocation of resources occurs as each task is assigned to one of processors 402–405 from controller 401. As controller 401 assigns a task to a processor in the system, the resources necessary for the processor to complete its task are allocated to it. In one embodiment, the reallocation of resources is limited to obtaining the resource(s) from a neighboring processor. In another embodiment, the processors may have a master/slave relationship among themselves, designated either by the controller or through the system design, such that a processor may only obtain the resources of a processor which is a slave, to some extent, to the processor needing the resource(s). In one embodiment, to obtain the resources that are associated with another processor, the processor signals to the slave processor so that the slave processor relinquishes any control over those resources.

To implement the computer system having reallocatable resources, a switchable common bus 410 is coupled to the site resources. The switchable common bus 410 allows any site to consume resources of other sites. In the currently preferred embodiment, the switchable common bus 410 allows each site access to the resources of another site because all of the sites are initially mapped into each others resources. In one embodiment, the sites are initially mapped into each others resources using a binary ascending scheme where each of the processors 402–405 are ordered and each of their resources, such as memory or I/O, are mapped in the same order. In other embodiments, the resources may be generally allocated to a TYPE pool, and each processor would request the resources it needs from the type pool and establish mapping such that the resource is permanently mapped to the process and not accessible (or delayable as in a bus hold) by other processors. Another scheme would be to have the resources soft matrixed initially to all processors and then have the soft matrix change into a hard mapping during resource allocation for that process.

Each processor is associated with a sub-controller (e.g., sub-controller 406A–409A) to facilitate the reallocation of resources. In other words, the present invention uses N independent sub-controllers in conjunction with switchable common bus 410 to allocate the site resources. In the currently preferred embodiment, N equals the number of processors in the system, such that each processor has its own sub-controller to aide in resource allocation. Referring to FIG. 4, each of sub-controllers 406A–409A are shown in resources 406–409, respectively, such that in the currently preferred embodiment, each of the sub-controllers 406A–409A is a slave to its associated processor. For instance, processor 402 is the master and sub-controller 406A is its slave. When a processor is assigned a task, it identifies the resources needed by the task and signals its sub-controller to indicate if any additional resources are required by the task. If the amount of resources currently allocated to the processor are not enough to perform the task, the sub-controller obtains the necessary resources from another of the processors in the system. Although each of sub-controllers 406A–409A are shown among the resources 406–409, respectively, each may be separately coupled to allow access to common bus 410.

Note that in such an arrangement, the sub-controller of the present invention may also use the resources of its associated processor. For instance, if a sub-controller wishes to access the system memory in its resources grouping, then the sub-controller notifies its processor that a read or write to memory must be performed and then obtains control over common bus 410. In order to accomplish this, the processor is placed in a hold state so that the sub-controller retains control of the resources on the bus. In the currently preferred embodiment, the sub-controller places its processor in a hold state using a hold signal. Referring back to FIG. 4, hold signals 406B–409B are shown coupled from sub-controllers 406A–409B respectively to processors 402–405 respectively. In this configuration, each sub-controller is able to be the master, while its associated processor is a slave. Thus, the present invention provides a sub-controller which acts as both a master and a slave.

The sub-controller is allowed to gain control of the resources so that they may be changed quickly. For example, when the power supplies need to be changed, the sub-controller performs the function, instead of the processor. One of the reasons the sub-controller is able to effect changes more quickly is because the processor generates control signals to effect the change using a high level language, while a sub-controller uses a low level language in conjunction with hardwired logic to generate the control signals. Since the sub-controller operates using a language at a lower level than that of the processor, the control signals necessary to create a change are generated more quickly. In this manner, the change may occur more quickly. In addition, having the sub-controller modify the memory or resource space of the processor enables the programmer to simplify the interface between the sub-controller program and the processor program since handshaking software or mailbox communication is eliminated. Note that control may be transferred between the sub-controller and the processor on a cycle by cycle basis. Thus, the sub-controller may become a master or a slave on a cycle by cycle basis. By allowing the sub-controller access to the resources, the overhead required in switching from sub-controller control to system processor control in order to transfer information between the controlling processor and the resource is reduced.

Figure 5:
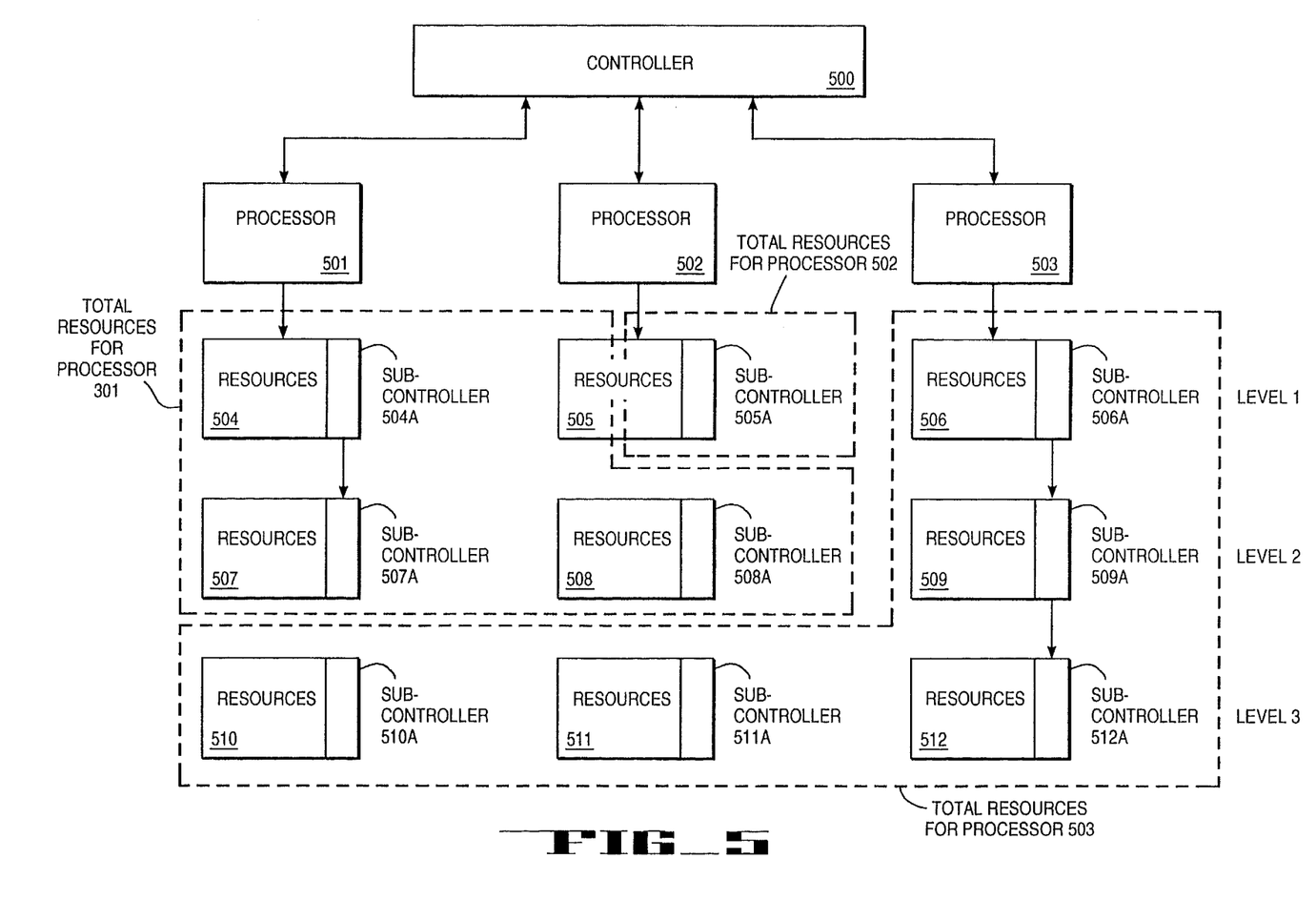
FIG. 5 illustrates a hierarchical system according to the present invention.

The present invention is also applicable to hierarchical computer systems in which resources have access to other resources. Such a system is shown in FIG. 5. Referring to FIG. 5, controller 500 is shown coupled to processors 501–503 to assign tasks to be performed. Originally, processors 501–503 are associated with and coupled to resources 504–506 respectively. Similarly, resources 504–506 are coupled to and associated with resources 507–509 respectively, which are coupled to and associated with resources 510–512 respectively. Resources 504–506 are coupled to a first common bus (not shown) as those in FIG. 4. Also, each set of resources 507–509 and 510–512 is coupled to a second common bus and a third common bus respectively (not shown). Note that although only three processors are shown, the number may vary. Similarly, the actual numbers of resources sets may also vary depending on the system architecture and number of processors.

Each of the resources 504–512 in the hierarchical computer system includes a sub-controller which is able to allocate the resources on the common bus to which it is coupled to its associated processor (or resources). Also, each sub-controller can control the resources on the lower level. For instance, the sub-controllers of resources 504–506 (level 1) can control the resource 507–509 (level 2). Similarly, resources 507–509 (level 2) can control resources 510–512 (level 3).

In the currently preferred embodiment, the control of the lower level resources is accomplished using the sub-controllers and the common bus arrangement. Each sub-controller of the resources 504–506 controls the sub-controller of resources 507–509 respectively. Similarly, the sub-controllers of resources 507–509 control the sub-controllers of resources 510–512.

Processors 501–503 have access to all of the resources in the system through the use of sub-controllers, such as sub-controllers 504A–506A respectively (of resources 504–506 respectively). For instance, because of the common bus arrangement, sub-controller 504A may reallocate resources 505 and 506 for use by processor 501, as well as control sub-controller 507A (of resources 507) to gain control of resources 507–509 (which are coupled to a common bus). The control of sub-controller 507A could also allow the reallocation of resources 510–512 for processor 501 by controlling the sub-controller 510A, which could control the reallocation of resources 510–512 through their common bus.

FIG. 5 illustrates an example of the hierarchical control which may be established by the present invention wherein the total resources allocated for each of processors 501–503 are shown. The total resources for processor 501 include all of resources 504, 507 and 508 and a portion of the resources 505. These resources are allocated by signaling sub-controller 504A which through its common bus causes the reallocation of a portion of resources 505 for use with processor 501. Also, sub-controller 504A controls sub-controller 507A which through its common bus causes the reallocation of resources 508 to be combined with its own resources 507 for use by processor 501. The total resources for processor 502 include only the remaining portion of resources 505 which are already allocated to it. The total resources for process 504 include all of resources 506 and 509–512. This allocation of resources is established by signaling sub-controller 506A, which signals sub-controller 509A, which signals sub-controller 512A. Sub-controller 512A causes all of the resources 510–512 on the common bus to be reallocated for use by processor 503.

It should be noted that as long as a control path exists to a lower level, the resources on that level may be allocated for use by the level above. Thus, as illustrated in FIG. 5, since a control path for processor 503 to the level 3 resources (i.e., resources 510–512), then those resources could be allocated for its use.

Note that the present invention may be applied to mainframe systems and advanced node-based systems. In a basic multi-processor computer system, the present invention reduces the resources required in a parallel architecture without sacrificing power. The present invention may also be applied to testers for integrated circuits. When applied to integrated circuit (IC) testers, the present invention reduces test time and lowers system cost, such that the present invention provides a reduced cost advantage. Test time is reduced by having the sub-controllers being able to modify the resources of the higher level processor without having to implement handshaking, such as between a pattern generator and the overall system controlling processor.

One Application of the Present Invention

One application of the present invention is a multi-site tester for integrated circuits. In the currently preferred embodiment, the tester is a 4 site tester in which each site comprises a 48 pin grouping. Note that the present invention is not limited to such a system. For example, the tester could accommodate any number of devices. For instance, the tester could have 8 sites, 16 sites, etc. Also, each site does not have to be partitioned into 48 pin groupings. The tester could be partitioned into pin groupings of various numbers and sizes. For example, the each site could comprise a 64 pin grouping or sites could include sites of 48 and 64 pin grouping. Thus, the system is modular based upon a non-symmetric architecture, which is where all of the resources are not the same per site. (A symmetric architecture is simply a non-symmetric system implemented where all of the modules for each site are identical.)

Note that each site in the tester is configurable. That is, the test may accommodate different types and sizes of devices (e.g., different numbers of pins). By allowing each of the sites in the multi-site tester to be configurable, different types of devices may be tested at the same time. Note that in the currently preferred embodiment, each pin grouping is associated with a processor. Since each pin grouping is associated with a processor, the smaller number of pin groupings for each site, the greater the number of processors that will be required for the same total pin count in the tester.

Figure 6:
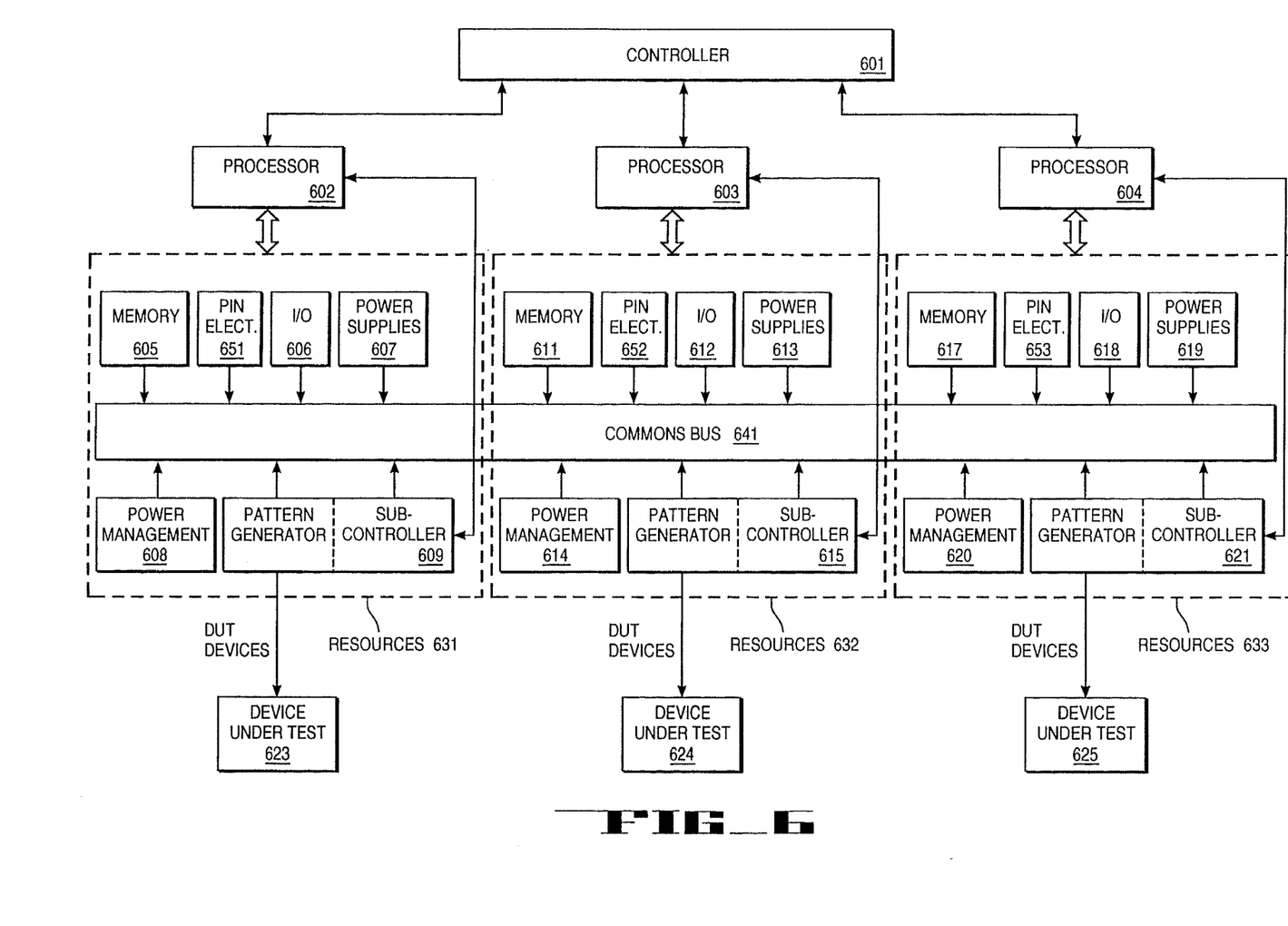
FIG. 6 is a block diagram of the multi-site testing arrangement of the present invention.

A block diagram illustrating one embodiment of the present invention is shown in FIG. 6. Referring to FIG. 6, tester 600 comprises controller 601, processors 602–605, and resources 606–609. Controller 601 is coupled to each of processors 602–605 to control their operation. Processors 602–604 are coupled to resources 631–633 respectively, including pattern generator/sub-controllers 609, 615 and 621 respectively. Note that the sub-controllers are also coupled to each of their associated processors to provide that processor with a hold signal to enable the sub-controller to obtain control of the resources. In one embodiment, resources 631 comprises memory 605, I/O 606, power supplies 607, power management unit 608, pin electronics 651 and pattern generator/sub-controller 609. Resources 632 comprises memory 611, I/O 612, power supplies 613, power management unit 614, pin electronics 652 and pattern generator/sub-controller 615. Also, resources 633 comprises memory 617, I/O 618, power supplies 619, power management 620, pin electronics 653 and pattern generator/sub-controller 622. Note that although each of resources 631–633 includes memory, I/O, power supplies, power management and a pattern generator in the currently preferred embodiment, the present invention is not limited to such a system. In other embodiments, the resources may not include nor be limited to these resources. For instance, in one embodiment, the resources may not all include power management. Note that the resources may include pin electronics and error analysis/repair routines. Note that each individual resource in resources 631–633 is coupled to common bus 641. Each of the pattern generators 609, 615 and 622 is coupled to devices under test (DUTs) 623–625 respectively.

Each of processors 602–604 provides a separate testing environment in conjunction with its resources 631–633 respectively. Each of processes 602–604 operates with its resources 631–633 respectively in a manner well-known in the art to provide test (DUT) vectors to test DUTs 631–633 respectively.

Controller 601 is responsible for establishing the loading order of the tasks to be performed by processors 602–605 in the system. Note that in the currently preferred embodiment, the tasks are test programs for testing a specific integrated circuit type. In the present invention, each of processors 602–605 are capable of running independent tasks at the same time. In other words, each of processors 602–604 may run different test programs at the same time. Each of processors 602–605 has access to resources 606–609 to complete the assigned tasks.

The task loading order is established in order to allow the resources to be allocated among each of the processors. Before controller 601 assigns a task to a particular processor in the system, the processor indicates the amount of resources it has available in its associated resource group (e.g., resource 631). In the present invention, controller 601 provides tasks to processors that have available resources, even if the resources available are minimal because the processor is always able to obtain more from the neighboring processors. Therefore, controller 601 initially sends a task to the first processor, such as processor 602, which will consume as many of the resources as necessary to complete the task, including those of other processors in the system. These additional resources may constitute additional pattern generation width (i.e., the bit width pattern), additional power supplies available, pin electronics, peripherals, etc. Then processor 602 signals controller 601 after having the necessary resources reallocated to it. When signaled, controller 601 proceeds to assign the next task to the next processor.

Note that in the currently preferred embodiment, controller 601 will not assign a task to a processor that does not have any resources left, even though resources of the other processors are available to be consumed. In this case, if all of the resources of the processor are allocated to another processor in the system, then the processor shuts down. In the currently preferred embodiment, the processor shuts down in response to a signal from controller 601. In other embodiments, controller 601 would provide a task to the processors in order regardless of whether a processor has any resources remaining because the processor could always obtain resources from its neighboring processors. In still other embodiments, a processor may have to have some minimal amount of resources available to be assigned a task.

In the currently preferred embodiment, each of processors 602–604 only has access to resources 631–633 respectively and those resources associated with processors which are slaves to the processor. For example, processor 602 has access to resources 631 and any portion, or all, of the resources 632 associated with processor 603 when processor 603 is a slave to processor 602. On the other hand, processor 603 cannot access resources 631 in the currently preferred embodiment if processor 603 is a slave to processor 602.

In the currently preferred embodiment, the allocation of resources is performed with the use of logic configurable arrays (LCAs). LCAs allow the present invention to redefine the mappings of the different resources. In effect, the LCAs remap the resources for the system so that the resources may be reallocated. As far as a processor is concerned, the remapping is transparent, such that the processor is completely unaware that its original allocation of resources has been reduced. Therefore, the LCAs allow the amount of resources available to a processor to be scaled up or down depending on the requirements of the task. Note also that in the present invention, a programmable array logic (PAL) could be used if erasable, such that it may be reconfigured. Also note that in normal systems, a bus controller would map out each resource type and the bus controller would enable a particular address range in order for access to be granted to a particular resource. However, in the prior art, these mappings are permanent.

Figure 7:
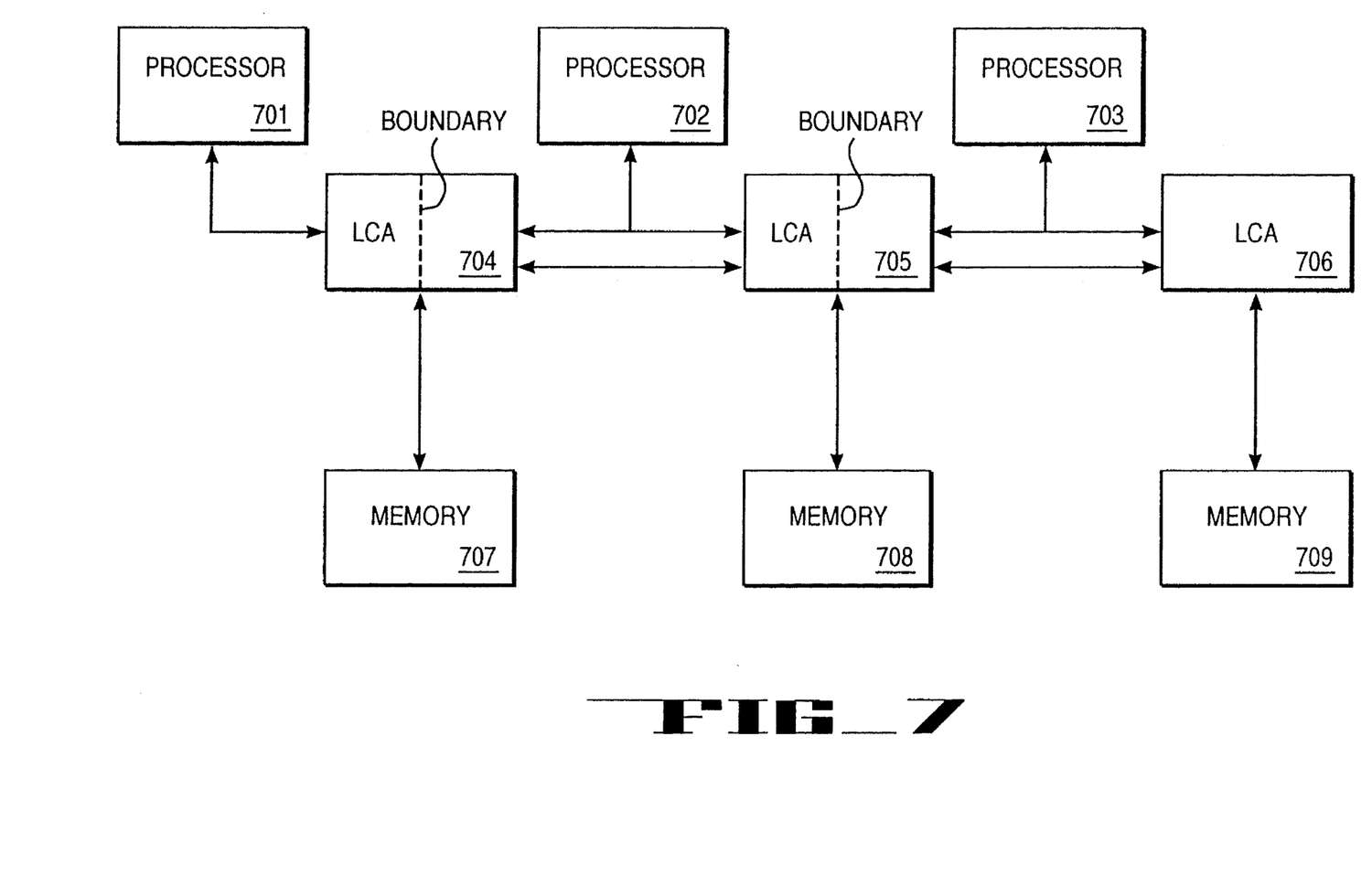
FIG. 7 illustrates one portion of the tester of the present invention having logic configurable arrays.

In the currently preferred embodiment, each resource (e.g., memory) is mapped continuously with an LCA governing access to some predefined portion of the total mapping for each resource. An example is shown in FIG. 7. Referring to FIG. 7, memories 707–709 are coupled to LCAs 704–706, such that memories 707–709 form one continuous memory. LCAs 704–706 permit the memories to be accessed and, thus, are the memory LCAs. It should be noted that in the currently preferred embodiment, access to every resource is governed by an LCA. The LCAs operate in a throughput environment wherein the LCAs are coupled in a chain with the processor positioned between each coupled pair of LCAs. Referring to FIG. 7, LCA 704 is coupled to LCA 705, and LCA 705 is coupled to LCA 706, thereby forming an LCA bus. Processor 701 is coupled to LCA 704. LCA 704 is also coupled to processor 702. LCA 705 is coupled to both processor 702 and processor 703. Because of this configuration, processor 701 can be given access to memories 708 and 709, as well as its allocated memory 707. Likewise, processor 702 can be given access to memories 707 and 709, as well as its allocated memory 708. Similarly, processor 703 can be given access to memories 707 and 708, as well as to its allocated memory 709. Thus, the LCAs are coupled on a bus that allows the resources to be allocated among the processors.

To permit resources to be reallocated, each LCA is capable of providing a movable boundary. This boundary is set by the sub-controller associated with its processor once a task has been given. The sub-controller sets the boundary by loading a fuse map into the LCA. The fuse map programs the LCA, wherein different interconnections are made internally, such that the LCA is internally configured. Once set, the boundary allows a processor access to only that portion of a resource (e.g., memory) which is in its partition. These boundaries are only permanent while a particular processor requires use of that resource. Once a task is completed, the boundary may be moved or removed.

Note that the LCAs also allow a processor to be masked, such that it cannot gain access to the resources associated with the LCA. Therefore, if a particular processor requires all of another processor's resource (e.g., all of its allocated memory), then that processor without that remaining resource may be masked, such that it is prevented from accessing any of that particular resource.

Adding resources in a tester environment can consist of adding additional pin electronics channels and associated pattern generator vector width and control functions, adding additional power supplies for voltage connection to the DUT, adding timing generator channels for additional resolution and timing parameters on signals driven to and received from the DUT, increasing the amount of memory needed for the process to handle additional information storage for the task, or adding status routing (route conditions that exist in the system) to route and format status signals from various elements of the system to the system processors and sub-controllers.

As an example, suppose that it was necessary to route an additional power supply voltage to a DUT pin for a particular test and then discarding connection once the test was done. Either the processor or subcontroller would address the type of required resource, which are in a general resource pool and are allocated on a first access basis. In other words, neither the processor or sub-controller need to know what resources are free, they simply request them by accessing a general device. For example, if the user program is already using power supplies designated a power_supply_1 through power_supply_4, the user simply identifies a power supply 5, which would have a system mapping local to the processor or sub-controller, but would not exist until requested by accessing it through a resource pool. The routing and connection of the power supply to the local processor power_supply_5 would be handled by the LCA. Other sub-controllers and processors would not be able to gain control of that particular power_supply_5 (from the physical mapping) because it has already been allocated, but would still be able to address other power supplies from the resource pool as power_supply_5. In this manner, the physical resource (not a physically mapped resource) becomes part of the sub-controller or processor resources. When a resource, such as the above supply, is accessed, a physical supply is physically mapped to a controller.

Similarly, additional pin electronics channels along with needed pattern generator bit fields can be added to a resource pool of a sub-controller or processor.

Figure 8:
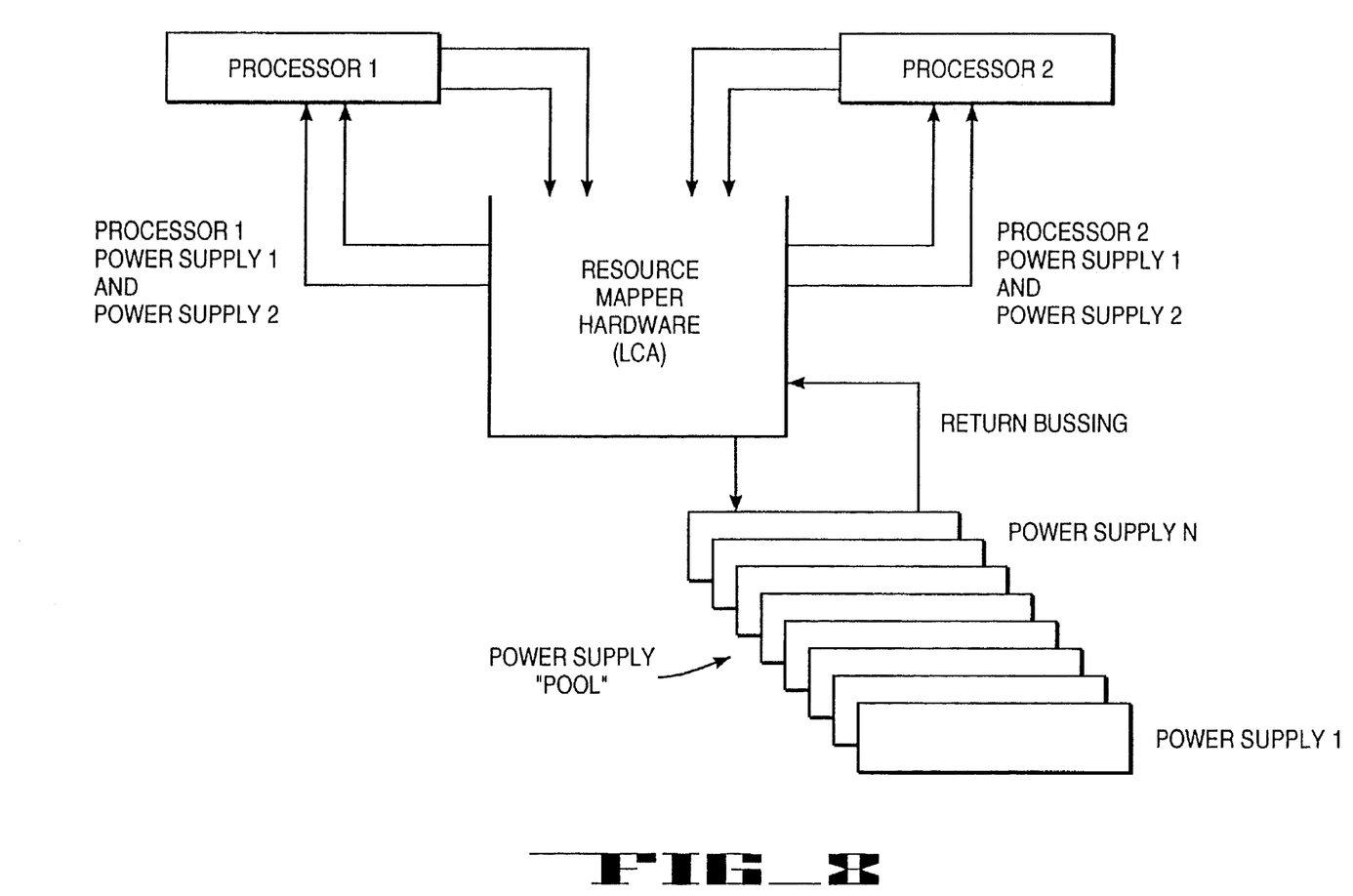
FIG. 8 illustrates the relationship between the resource pool and mapped resources for a processor.

FIG. 8 shows the relationship between the resource pool and mapped resources for a processor. Note that the same relationship exists between a sub-controller and the resource pool.

One feature of the present invention is that one can modify the source of the data (i.e., where the data is coming from) from the pin electronics on the fly. In other words, in the present embodiment, the pin electronics are remapped to provide data and result signals such as errors, DUT status, or parametric results to the sub-controller and processor that needs to expand its resources to complete the task. This allows the system programmer to ignore bit width limitations and routing of status signals back to the controlling process.

Because each of the sub-controllers that are associated with each processor of the present invention may also use the resources of their base system processor, the sub-controller is able to gain control of the resources, thereby becoming a master. Thus, the sub-controller takes over and becomes the master and the processor becomes the slave. The sub-controller places the processor in a hold state to gain access to the resources coupled to the common bus. This allows changes in the resources to be made faster since the change does not have to occur via the high level code of the processor. To reiterate, the control of the bus resources may be transferred between the sub-controller and the processor on a cycle by cycle basis. Note also that this allows parametric tests to be performed from the pattern generator, since parametric testing is simply a task that is performed by the processor. Since the sub-controller has all of the resources of the processor, it can literally be used in place of the processor when a task that would normally be carried out by the processor needs to be carded out by the sub-controller. In essence, this saves the implementation time and execution time of a handshaking interface.

The new sub-controller architecture of the present invention reduces the resources that are required to perform testing because each of the resources in the system may be better utilized. The present invention also provides for intelligent task sizing allocation of system resources that allow a multi-site tester to configure itself to a single site if the desired resources are required.

Moreover, the present invention provides a more cost effective testing solution. Since the additional resources are automatically allocated from other sites if they are needed, the present invention is not restricted to having each site sized with the maximum needed resource requirements. Instead, the present invention allows the purchased configuration to be sized for the largest volume requirements and/or the minimal per site resources for a predetermined number of sites.

Whereas many alterations and modifications of the present invention will no doubt become apparent to a person of ordinary skill in the art after having read the foregoing description, it is to be understood that the particular embodiment shown and described by way of illustration are in no way intended to be considered limiting. Therefore, reference to the details of the preferred embodiments are not intended to limit the scope of the claims which themselves recite only those features regarded as essential to the invention.

Thus, a multi-processing system has been described.

We claim:

1. An integrated circuit tester for testing a plurality of integrated circuits at the same time, wherein the plurality of integrated circuits is capable of including a plurality of types of integrated circuits, the tester comprising:

a plurality of processors, wherein each of the plurality of processors executes one of a plurality of test programs designed to test one of the plurality of integrated circuits, such that a plurality of test programs are executed;

a plurality of resources coupled to the plurality of processors, wherein each of the plurality of processors uses the plurality of resources when executing test programs to complete execution of at least one of the plurality of test programs, wherein each of the plurality of resources is initially allocated to the plurality of processors, such that a separate portion of the plurality of resources is initially mapped to each of the plurality of resources: and at least one controller to reallocate at least one of the plurality of resources, wherein said at least one of the plurality of resources is reallocated among processors as necessary to execute the plurality of test programs, such that at least one of the plurality of processors gains control of said at least one of the plurality of resources initially allocated to another of said plurality processors to test the integrated circuits.

2. The tester as defined in claim 1 further comprising a bus coupled to the plurality of resources, such that the plurality of resources share a common bus.

3. The tester as defined in claim 1 further comprising a controller for assigning each of the plurality of test programs to the plurality of processors, such that each of the plurality of processors executes one of the plurality of tasks designed to test one of the plurality of integrated circuits.

4. The tester as defined in claim 3 wherein a portion of the plurality of resources are reallocated when each test program is assigned by the controller.

5. The tester as defined in claim 1 wherein test programs executed by at least two of the processors are different, such that the tester tests at least two types of the integrated circuit types at the same time.

6. The tester as defined in claim 1 wherein each of the plurality of processors comprises a sub-controller to control reallocation of resources for said each of the plurality of processors.

7. An integrated circuit tester for testing a plurality of integrated circuits, wherein the plurality of integrated circuits is capable of including a plurality of types of integrated circuits, the tester comprising:

a bus;

a plurality of processors coupled to the bus, a controller for assigning a plurality of test programs to the plurality of processors, wherein each of the plurality of processors executes one of a plurality of test programs designed to test one of the plurality of integrated circuits, such that the plurality of test programs are executed;

a plurality of resources coupled to the bus and initially allocated to the plurality of processors, such that a portion of the plurality of resources is initially mapped to each of the plurality of processors, wherein each of the plurality of processors requires at least one of the plurality of resources when executing its test program; and a plurality of sub-controllers for allocating the plurality of resources to each of the plurality of processors, wherein each of the plurality of resources required by one of the plurality of processors to execute said one of a plurality of tasks is allocated to said one of the plurality of processors, such that at least one of the plurality of resources is reallocated to a processor other than said one of the plurality of processors to test the integrated circuits.

8. The tester as defined in claim 7 wherein each of the controllers is associated with one of the plurality of processors and allocates the plurality of resources in response to its associated processing means.

9. The tester as defined in claim 7 wherein the plurality of resources includes a plurality of resource types, and wherein each of the plurality of resource types is allocated to one of the plurality of processors.

10. The tester as defined in claim 7 further comprising a plurality of linear configurable arrays, wherein each of the plurality of linear configurable arrays is coupled to one of the plurality of resources, and wherein each of the plurality of linear configurable arrays is capable of coupling at least one resource to at least one of the plurality of processor through the bus, such that upon allocation of the plurality of resources each of the plurality of linear configurable arrays permits use of only that portion of its resource that is allocated to any of the plurality of processors.

11. An integrated circuit tester for testing a plurality of integrated circuits, wherein the plurality of integrated circuits is capable of including a plurality of types of integrated circuits, the tester comprising:

a bus;

a plurality of linear configurable arrays coupled to the bus;

a plurality of resources coupled to the plurality of linear configurable arrays, such that access to each resource is controlled by one of the plurality of linear configurable arrays;

a plurality of processors coupled to the bus, wherein each of the plurality of processors executes one of a plurality of test programs designed to test one of the plurality of integrated circuits, such that a plurality of test programs are executed, and wherein each of the plurality of processors requires at least one of the plurality of resources to execute its test program; and a plurality of controllers, each controller associated with one of the plurality of processors for allocating the plurality of resources to each of the plurality of processors, wherein each of the plurality of resources required by one of the plurality of processors to execute said one of a plurality of test programs is allocated to said one of the plurality of processors to perform the integrated circuit testing, wherein at least one of the plurality of resources initially mapped to a processor other than said one of the plurality of processors is reallocated to said one of the plurality of processors.

12. A computer system comprising:

a plurality of processors for executing a plurality of tasks;

a first bus for communication information;

a first plurality of sets of non-dedicated resources coupled to the bus for use by the plurality of processors in executing the plurality of tasks;

a first plurality of controllers coupled to the first plurality of sets of non-dedicated resources and the plurality of processors for allocating each of the non-dedicated resources in the first plurality of sets of non-dedicated resources to one of the plurality of processors, such that each of the plurality of resources required by each of the plurality of processors to execute each of the plurality of tasks is allocated to said each of the plurality of processors.

13. The computer system as defined in claim 12 further comprising:

a second bus for communicating information;

a second plurality of resources coupled to the second bus for use by the plurality of processors in executing the plurality of tasks;

a second plurality of controllers coupled to a respective one of the first plurality of controllers for allocating each of the resources in the second plurality of sets of resources to one of the plurality of processors, wherein each of the first plurality of controllers controls the second plurality of controllers, such that the second plurality of resources are allocated to one of the plurality of processors, such that each of the plurality of resources required by one of the plurality of processors to execute said one of a plurality of tasks is allocated to said one of the plurality of processors.

* * * * *

UNITED STATES PATENT AND TRADEMARK OFFICE
CERTIFICATE OF CORRECTION

PATENT NO. : 5,504,670
DATED : April 2, 1996
INVENTOR(S) : Barth et al.

It is certified that error appears in the above-identified patent and that said Letters Patent is hereby corrected as shown below:

In column 11 at line 7 delete "carded" and insert --carried--

Signed and Sealed this

Twenty-third Day of September, 1997

*Attest:*

BRUCE LEHMAN

*Attesting Officer*  *Commissioner of Patents and Trademarks*